(12) United States Patent
Imfeld et al.

(10) Patent No.: US 10,690,729 B2
(45) Date of Patent: Jun. 23, 2020

(54) METHOD, SYSTEM AND ASSEMBLY FOR DETERMINING A REDUCTION OF REMAINING SERVICE LIFETIME OF AN ELECTRICAL DEVICE DURING A SPECIFIC TIME PERIOD OF OPERATION OF THE ELECTRICAL DEVICE

(71) Applicant: Landis+Gyr AG, Zug (CH)

(72) Inventors: Joe Imfeld, Horw (CH); Andreas Rumsch, Ennetburgen (CH); Patrick Schmid, Muttenz (CH)

(73) Assignee: Landis+Gyr AG, Zug (CH)

( * ) Notice: Subject to any disclaimer, the term of this patent is extended or adjusted under 35 U.S.C. 154(b) by 0 days.

(21) Appl. No.: 16/100,440

(22) Filed: Aug. 10, 2018

(65) Prior Publication Data

US 2018/0348283 A1   Dec. 6, 2018

Related U.S. Application Data

(63) Continuation of application No. 15/023,697, filed as application No. PCT/EP2015/072918 on Oct. 5, 2015, now Pat. No. 10,073,130.

(30) Foreign Application Priority Data

Oct. 27, 2014 (EP) .................................. 14190420

(51) Int. Cl.
*G06F 17/13* (2006.01)
*G01R 31/62* (2020.01)
(Continued)

(52) U.S. Cl.
CPC ........... *G01R 31/62* (2020.01); *H01F 27/402* (2013.01); *G01R 31/2849* (2013.01); *G01R 31/343* (2013.01); *H01F 2027/406* (2013.01)

(58) Field of Classification Search
CPC ........ G01R 31/27; G01R 27/00; G01R 27/08; G01R 29/20; G01R 31/027; G01R 1/20;
(Continued)

(56) References Cited

U.S. PATENT DOCUMENTS 5,294,198 A * 3/1994 Schlagheck ............ G01N 25/72
250/332
7,609,070 B2 * 10/2009 Kagiyama ............ G01R 31/028
324/522
(Continued)

FOREIGN PATENT DOCUMENTS

CN        102662113 A        9/2012
CN        103226185 A        7/2013
(Continued)

*Primary Examiner* — Tung X Nguyen
*Assistant Examiner* — Robert P Alejnikov, Jr.
(74) *Attorney, Agent, or Firm* — Kilpatrick Townsend & Stockton LLP

(57) ABSTRACT

The present invention relates to a method of determining a reduction of remaining service lifetime of an electrical device during a specific time period. A measurement system is provided comprising a temperature measurement device, a current measurement device and a voltage measurement device. A temperature value, voltage values and current values are measured by using the measurement device. A harmonic load is determined based on the current values. A reduced maximum operating temperature is determined based on the harmonic load. An amount of transient overvoltages is determined based on the voltage values. A transient aging factor is determined based on the amount of
(Continued)

transient over-voltages. A temperature dependent aging factor is determined based on the temperature value and the reduced maximum operating temperature. Finally, the reduction of remaining service life is determined based on the specific time period, the transient aging factor and the temperature dependent aging factor.

15 Claims, 3 Drawing Sheets

(51) Int. Cl.
*H01F 27/40* (2006.01)
*G01R 31/34* (2020.01)
*G01R 31/28* (2006.01)

(58) Field of Classification Search
CPC ...... G01R 1/22; G01R 31/08; G01R 31/3658; G01R 11/00; G01R 13/00; G01R 19/00; G01R 21/00; G01R 22/00; G01R 25/00; G01R 29/00; G01R 33/00; G01N 27/025; G01N 27/42; G01N 31/02; G01N 2030/345; G01N 2030/645; G01N 27/4162; G01N 25/18; G01N 27/18
USPC ...... 324/547, 600, 713, 726, 127, 522, 425, 324/426, 432, 434, 439, 441; 702/1, 57, 702/64
See application file for complete search history.

(56) References Cited

U.S. PATENT DOCUMENTS

| | | | |
|---|---|---|---|
| 2005/0001627 A1* | 1/2005 | Anbuky | G01R 31/367 324/427 |
| 2005/0223782 A1* | 10/2005 | Dohi | G01N 33/28 73/53.01 |
| 2013/0024131 A1 | 1/2013 | Lamontagne | |
| 2013/0058375 A1* | 3/2013 | Hernandez | G01N 25/70 374/24 |
| 2013/0158897 A1* | 6/2013 | Jain | G01R 31/027 702/42 |
| 2013/0221983 A1* | 8/2013 | Anderson | G01R 31/027 324/547 |
| 2013/0243033 A1 | 9/2013 | Asano, Jr. | |
| 2013/0264994 A1* | 10/2013 | Schaefer | B60L 58/16 320/104 |
| 2013/0285671 A1 | 10/2013 | Hoffman | |
| 2013/0311113 A1 | 11/2013 | Basu | |
| 2014/0103937 A1 | 4/2014 | Khan | |

FOREIGN PATENT DOCUMENTS

| | | |
|---|---|---|
| CN | 103245519 A | 8/2013 |
| CN | 103323707 A | 9/2013 |
| CN | 103675621 A | 3/2014 |
| CN | 103792440 A | 5/2014 |
| JP | 2008066435 A | 3/2008 |
| KR | 20030013894 A | 2/2003 |
| KR | 20140041568 A | 4/2014 |

* cited by examiner

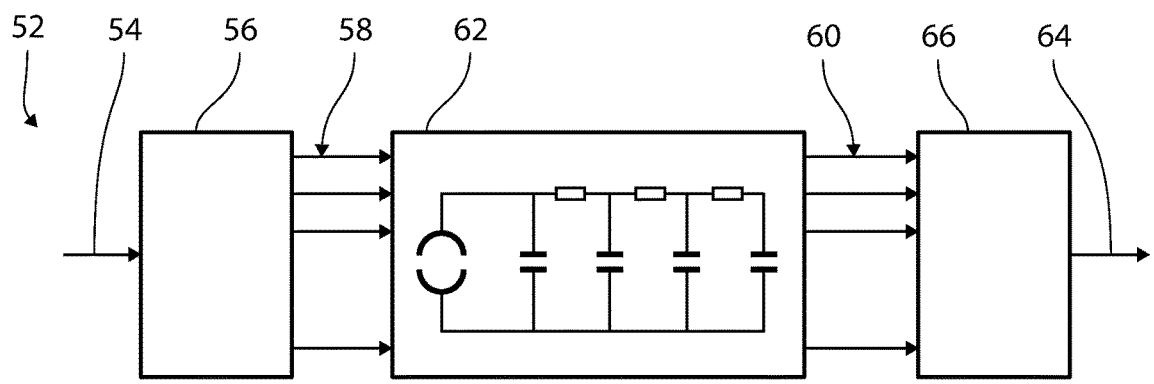
FIG. 3
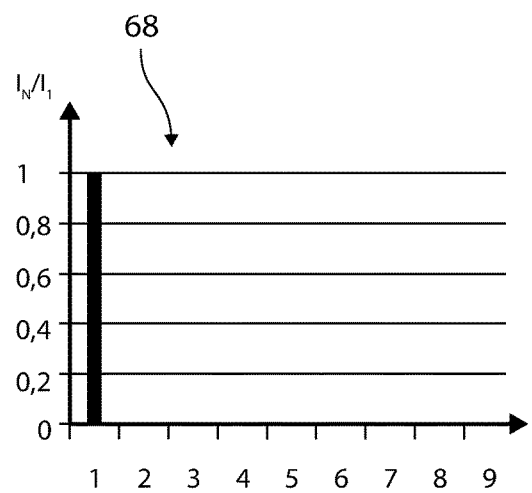
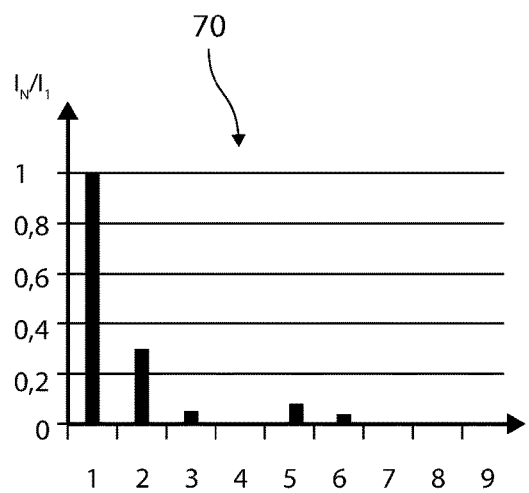
FIG. 4A
FIG. 4B

METHOD, SYSTEM AND ASSEMBLY FOR DETERMINING A REDUCTION OF REMAINING SERVICE LIFETIME OF AN ELECTRICAL DEVICE DURING A SPECIFIC TIME PERIOD OF OPERATION OF THE ELECTRICAL DEVICE

INTRODUCTION

The insulation of electrical devices is under stress during operation and will constantly deteriorate until the insulation capability is reduced to such a degree that the electrical device fails. The exchange of electrical devices may be planned or unplanned. A planned exchange takes place at a time when the electrical device still works but is deemed to be close to its service life end, whereas an unplanned exchange takes place when the electrical device fails, i.e. "run to fail". The service lifetime of the electrical device is highly dependent on events occurring during the operation of the electrical device.

Although a run to fail strategy will allow the electrical device to run for a longer time period and thereby reduce the total number of exchanges, the unplanned exchange typically involves a greater total cost due to the additional expenses associated with each failure. For instance, a planned exchange of a transformer may cost about EUR 10,000 less than an unplanned exchange. The additional expenses for an unplanned exchange may be caused by additional cost due to the right transformer being unavailable, additional installation costs due to a more complex installation after a failure, the regulator's penalty for power interruption of consumers and the cost for alternative power generation during the interruption. In the UK there are every year around 2,000 unplanned transformer exchanges caused by defects and interruptions, resulting in an annual extra spending of around EUR 20 Mio.

In the above example, an unplanned exchange will cost about 50% more than a planned exchange. Thus, in order for a "run to fail" approach to be more cost effective, the planned exchanges must occur 50% more often than the unplanned exchanges. Consequently, by using an appropriate method of estimating the reduction of remaining service lifetime of the electrical device, the "run to fail" approach can be avoided, and the overall customer satisfaction will increase. Electrical devices typically have a nominal service life, e.g. 50 years for a transformer. The easiest approach is to simply assume that all electrical devices last the whole nominal service life. However, this may lead to failures in case of special occurrences during the lifetime of the electrical device.

With respect to prior art in the present technical filed, the Chinese patent application CN103792440A relates to an early warning and fault diagnosis system which uses e.g. harmonics and temperature as input. Further, CN102662113 relates to a transformer diagnosis method including measuring temperature and various other entities, and CN103323707 relates to a transformer diagnosis method including measuring temperature and using a Markov probability process.

CN103245519A relates to a device for predicting the residual operation life of the power transformer. CN103675621 relates to a transformer bushing insulation life prediction device. JP2008066435 relates to a transformer life prediction device. KR1020140041568 relates to a method of estimating the remaining life of a transformer. US 2013/0243033 A1 relates to a method of assessing the remaining lifetime of a transformer by obtaining a sample of pressboard material that has been in contact with the fluid at its top surface. CN103226185 relates to a harmonic monitoring-based current transformer power module on-line fault diagnosis method.

Further relevant prior art include the European standard EN 50464-3 relating to the determination of the power rating of a transformer loaded with non-sinusoidal currents, and the Power Quality Application Guide, Harmonics—Selection and Rating of Transformers, issued by the Copper Development Association.

It is thus an object according to the present invention to provide technologies for determining a reduction of remaining service lifetime of an electrical device during a specific time period of operation of the electrical device.

SUMMARY OF THE INVENTION

Typically, the most promising methods used are condition based, i.e. the remaining service life depends on various events occurring during the service life of the electrical device. In the present context, electrical devices are to be understood as power electrical devices.

The above object and further objects which are evident from the below detailed description are according to a first aspect of the present invention achieved by a method of determining a reduction of remaining service lifetime of an electrical device during a specific time period of operation of the electrical device, the electrical device being connected to a power distribution network, the electrical device having a maximum operating temperature and a maximum operating voltage, the method comprising the steps of:

providing a measurement system comprising a temperature measurement device, a current measurement device and a voltage measurement device, measuring a temperature value corresponding to the temperature of the electrical device during the specific time period by using the temperature measurement device, measuring a set of voltage values corresponding to the voltage applied to the electrical device by the power distribution network during the specific time period by using the voltage measurement device, measuring a set of current values corresponding to the current applied to the electrical device by the power distribution network during the specific time period by using the current measurement device, determining an amount of harmonic load on the electrical device on the basis of the set of current values, determining a reduced maximum operating temperature of the electrical device on the basis of the amount of harmonic load and the maximum operating temperature, determining an amount of transient over-voltages on the power distribution network at the electrical device on the basis of the set of voltage values and the maximum operating voltage, determining a transient aging factor corresponding to the relation between the amount of transient over-voltages and the set of voltage values, determining a temperature dependent aging factor on the basis of the temperature value and the reduced maximum operating temperature, and determining the reduction of remaining service life on the basis of the specific time period, the transient aging factor and the temperature dependent aging factor.

The electrical device typically has a maximum operating temperature and a maximum operating voltage which are determined by the designer of the electrical device taking into account Insulation strength and insulation materials. The electrical device is connected to a power distribution network which may be any power distribution network from a low voltage network such as the 240V/120V, 60 Hz or 400V/230V, 50 Hz household mains outlet generally known in the US and Europe, respectively, up to 400 kV distribution lines used for long range power transmission, or even higher voltages such as 800 kV and 1 MV. The present method is carried out over a specific time period.

The nominal service life is greatly reduced in case of operation outside the above mentioned "normal" conditions. It has therefore been suggested to use a combination of linear aging and a condition based aging. Linear aging is the aging which occurs during normal operation of the device, i.e. when the device is operating below the rated maximum temperature, and with no harmonics and no transient over-voltages. The linear aging is based on the assumption that the electrical device does not fail until expiry of the nominal service life. For the specific time period which passes during linear aging, the same specific time period is deducted from the service life. Thus, an electrical device having a nominal service life of 50 year and has served for 5 years will have 45 years remaining service life. When the remaining service life reaches 0 years, the electrical device is exchanged.

The applicant has found out that apart from the linear aging, the life span of electrical devices are determined by three factors which may be used as basis for condition based aging, these factors being an exponential aging factor, aging through current loads with harmonics and aging through transient over-voltages. The exponential aging is used in case the electrical device is operating above its maximum operating temperature. The operating temperature depends on the electrical losses on one side and the available cooling on the other side. The electrical losses depend on the resistance and the current in the electrical device whereas the cooling depends on the ambient temperature surrounding the electrical device. The exponential aging involves an increased aging compared to lineal aging, and the increment in aging increases with temperatures above the maximum operating temperature. Thus, by operating the electrical device for 5 years under exponential aging, the deduction in service life in relation to the nominal service life will be more than 5 years, such as 10 years under slightly elevated temperatures, or 25 years under more severely elevated temperatures. Thus, an electrical device having a nominal service life of 50 years, may already be at the end of its service life after 10 years under the above severely elevated temperatures. The reason for the exponential aging is the exponential decay of the insulation experienced at excessive temperatures.

In the above mentioned reference document Power Quality Application Guide, Harmonics—Selection and Rating of Transformers, the influence of harmonics on the temperature of transformers is discussed. Harmonic currents will result in additional losses which will raise the winding temperature of the transformer. Thus, harmonic currents applied to an electrical device will de-rate or reduce the maximum operating temperature, or in other words, the electrical device will be subjected to exponential aging at a temperature lower than the rated maximum operating temperature.

Further, transient over-voltages will apply an increased electrical field over the electrical device. This will cause an additional stress on the Insulation of the electrical device. Thus, the presence of transient overvoltage will add an additional factor to the aging of the electrical device.

The present method is carried out by use of a measurement system. The measurement system includes a temperature measurement device. The temperature measurement device typically does not measure the temperature directly inside the electrical device since this would compromise the insulation, and thus typically the temperature is measured at another location and the temperature inside the electrical device is derived.

The measurement system also comprises a current measurement device and a voltage measurement device. The current may be measured on the input phases by using a Rogowski coil or any similar device. The voltage may be measured between the input phases and/or between the input phase and ground as generally known in the art. The sample rate for the current and voltage measurement should be made using high speed A/D converters and be sufficiently high to capture any current harmonics and/or voltage transients.

The specific time period may be in the same order of magnitude as the temperature is expected to change. Compared to the current and voltage which changes at least according to the power distribution network frequency and even higher when considering higher order harmonics and transients, the changes in temperature are slow. Thus, the sample period for current and voltage will be smaller than the specific time period, thus during the specific time period a set of voltage values and a set of current values will be generated, whereas typically a single temperature value will suffice.

The reduction of remaining life of the electrical device over the specific time period is calculated following the above-mentioned method steps. The amount of harmonic load corresponds to the relation between the current magnitude in the fundamental frequency and the current magnitude in the higher order harmonics. The reduced operating temperature compensates for the additional heating of the insulation of the electrical device by the harmonic currents. The temperature dependent aging factor is calculated taking into account the exponential degradation of the insulation for every increment of temperature above the reduced operating temperature. Further, the transient aging factor takes into account the additional stress suffered by the insulation when the voltage exceeds the maximum operating voltage.

According to a further embodiment of the first aspect, when the temperature value is equal to or lower than the reduced maximum operating temperature, the temperature dependent aging factor is equal to one, whereas when the temperature value is higher than the reduced maximum operating temperature, the temperature dependent aging factor is exponentially dependent on the difference between the temperature value and the reduced maximum operating temperature.

The temperature dependent aging factor represents the increased aging at elevated temperatures. Consequently, when the temperature value is equal to or lower than the reduced maximum operating temperature, the temperature dependent aging factor is equal to one resulting in a linear aging, i.e. the reduction of remaining service lifetime (excluding the influence of transient over-voltages) is equal to the specific time period of operation, whereas when the temperature value is higher than the reduced maximum operating temperature, exponential aging replaces linear aging and the temperature dependent aging factor Is greater than one, implying an accelerated aging, i.e. the reduction of remaining service lifetime (excluding the influence of transient over-voltages) is equal to the specific time period times a factor greater than one leading to a time period of service life reduction which is greater than the specific time period.

According to a further embodiment of the first aspect, the electrical device is an inductive electrical device, preferably a transformer, more preferably a secondary distribution transformer.

The present method is preferably used together with an inductive electrical device, such as a transformer or electrical motor. Preferably a static device is used such as a transformer. Most preferably the transformer is a secondary distribution transformer such as a transformer between a medium voltage network and a 240V/120V, 60 Hz or 400V/230V, 50 Hz low voltage network generally known in e.g. US and Europe, respectively.

According to a further embodiment of the first aspect, the temperature measurement device is adapted to measure the ambient temperature outside the electrical device and derive the set of temperature values from the ambient temperature, the set of current values and the set of voltage values.

The temperature cannot normally be measured directly inside the electrical device since this would compromise the insulation. The temperature may be calculated using the current values and the voltage values, from which the total power used by the electrical device may be derived. A small portion of the total power is lost and forms heat energy inside the electrical device. The loss factor is normally provided by the designer or may be derived from the internal resistance of the electrical device, such as winding resistance of the transformer. The heat is transported to the outside and the rate of heat dissipation is determined by the ambient temperature. A heat model may be established for calculating the temperature inside the electrical device. Other parameters may be included in the heat model, such as the humidity. The materials used for the electrical device and the provision of cooling fans etc. influence the heat dissipation rate.

According to a further embodiment of the first aspect, the specific time period of operation is between 1 second and 60 minutes.

As stated above, the temperature changes slowly compared to the electrical parameters. Thus, a time scale as indicated above may be suitable for the present method.

According to a further embodiment of the first aspect, the measurement system further comprises a processor communicating with the temperature measurement device, the current measurement device and the voltage measurement device.

The above method is preferably executed in a processor, such as a microprocessor controlled by suitable control software.

According to a further embodiment of the first aspect, the reduction of remaining service lifetime is equal to the specific time period times the transient aging factor times the temperature dependent aging factor.

Typically, the transient aging factor and the temperature dependent aging factor multiply with the elapsed time, i.e. the specific time period, in order to form an increased time period corresponding to the reduction of remaining service lifetime. In case the transient aging factor and the temperature dependent aging factor are equal to one, the reduction of remaining service lifetime over the specific time period is equal to the specific time period, otherwise it is greater than the specific time period. According to a further embodiment of the first aspect, the set of current values is divided into a set of fundamental currents and a set of higher order harmonic currents and the reduced maximum operating temperature is a function of the maximum operating temperature and a relation between the set of fundamental currents and the set of higher order harmonic currents.

The harmonic load is dependent on both the number h of the harmonic order and of the magnitude of the h-order harmonic current. Thus, the higher the frequency of the harmonic current, the higher the harmonic load. The magnitude of the higher order harmonics is described as a relation relative to the magnitude of the fundamental current. The maximum order of magnitude of harmonics hmax which may be derived from the set of current values depends on the sampling rate of the A/D converter.

According to a further embodiment of the first aspect, the difference between the maximum operating temperature and the reduced maximum operating temperature is described according to the following formula:

$$\Delta Topmax = \text{function}\left[\sum_{h=1}^{h=hmax}\left(\frac{Ih}{I1}\right)^2\right]$$

wherein ΔTopmax is the difference between the maximum operating temperature and the reduced maximum operating temperature, Ih is the magnitude of the $h^{th}$ harmonic and I1 is the fundamental current.

The above formula is preferably used for calculating the reduction of the maximum operating temperature when the electrical device is subjected to a harmonic current. The function may include correction factors which may be empirically derived and which are discussed in connection with the detailed description of the drawings.

According to a further embodiment of the first aspect, the transient aging factor depends on a magnitude and a duration of voltage values belonging to the set of voltage values and exceeding the maximum operating voltage.

A high voltage will apply a high electrical field to the insulation. In case the voltage exceeds the maximum operating voltage the insulation will be damaged. The total damage depends on the duration of the exposure to the excessive electrical field. The sampling period of the A/D converter should be short enough to capture the voltage transients.

According to a further embodiment of the first aspect, the transient aging factor is described according to the following formula:

$$k*t/T*((U_0/U\text{max}-1))/2$$

where k is a constant, t is the time the voltage exceeds the maximum operating voltage, T Is the specific time period, $U_0$ is the transient overvoltage peak, and Umax is the maximum operating voltage.

The above formula is preferably used for calculating the reduction of the maximum operating temperature when the electrical device is subjected to a harmonic current. The function may include correction factors which may be empirically derived and which are discussed in connection with the detailed description of the drawings.

The above object and further objects which are evident from the below detailed description are according to a second aspect of the present invention achieved by a method of determining the remaining service life of an electrical device by storing a nominal service life of the electrical device in a memory unit and during a specific time period of operation of the electrical device deduct from the nominal service life a reduction of remaining service lifetime derived according to the first aspect.

When installing the electrical device, a number of "life points" corresponding to the service life of the electrical device may be stored in the memory unit. During operation, for every specific time period, a determined number of "life points", corresponding to the reduction of remaining service lifetime, may be deducted from the number of "life points" stored in the memory unit. When all of the "life points" have been used up or nearly used up, such that only e.g. 5%, 10% or 20% of the life point remain, an alarm may be sent to the operator of the electrical device to schedule an exchange of the electrical device.

Further, by studying the decay of "life points" over an extended time period, the future use of life points may be estimated such that a date for complete depletion of life points may be estimated using statistical methods. This may help schedule the exchange of the electrical device long in advance.

It is evident that any of the embodiments discussed above under the first aspect may be equally applicable for the second aspect.

According to a further embodiment of the second aspect, the electrical device is already used for a first time period and the nominal service life is adaptively adjusted based on the first time period and the reduction of remaining service life during a second time period.

The reduction of life points may also be used retroactively. Using the above-mentioned statistical methods, the historical use of life points may be estimated using life point reductions over an extended time period. Thus, when an already existing electrical device is retrofitted in accordance with the present method, during a first time period, such as a year, the total deduction of life points may be used for adaptively adjusting the life points used during the time period before the method was employed.

The above object and further objects which are evident from the below detailed description are according to a third aspect of the present invention achieved by a system for determining a reduction of remaining service lifetime of an electrical device during a specific time period of operation of the electrical device, the electrical device being connected to a power distribution network, the electrical device having a maximum operating temperature and a maximum operating voltage, the system comprising a measurement system, the measurement system comprising:

a temperature measurement device for measuring a temperature value corresponding to the temperature of the electrical device during the specific time period, a current measurement device for measuring a set of current values corresponding to the current applied to the electrical device by the power distribution network during the specific time period, a voltage measurement device for measuring a set of voltage values corresponding to the voltage applied to the electrical device by the power distribution network during the specific time period, and a processing unit for determining an amount of harmonic load on the electrical device on the basis of the set of current values, determining a reduced maximum operating temperature of the electrical device on the basis of the amount harmonic load and the maximum operating temperature, determining an amount of transient overvoltages on the power distribution network at the electrical device on the basis of the set of voltage values and the maximum operating voltage, determining a transient aging factor corresponding to the relation between the amount of transient over-voltages and the set of voltage values, determining a temperature dependent aging factor on the basis of the temperature value and the reduced maximum operating temperature, and determining the reduction of remaining service life on the basis of the specific time period, the transient aging factor and the temperature dependent aging factor.

The system may be installed as a) a new system on a newly installed electrical device, b) as a new system on an already installed electrical device and c) as a replacement of a defective system at an already installed electrical device. Whereas the installation a) will assign the electrical device designers total nominal lifetime as the initial number of life points, the installation b) will assign an adaptively derived reduced number of life points as discussed under the second aspect, and the installation c) will use the actual number of remaining life points as the initial number of life points.

It Is evident that any of the embodiments discussed above under the first and second aspects may be equally applicable for the third aspect.

The above object and further objects which are evident from the below detailed description are according to a fourth aspect of the present invention achieved by an assembly comprising an electrical device, preferably an inductive electrical device more preferably a transformer, most preferably a secondary distribution transformer, and a system according to the third aspect.

The present system discussed under the third aspect is preferably used together with an inductive electrical device, such as a transformer or electrical motor, to form an assembly. Preferably a static device is used such as a transformer. Most preferably the transformer is a secondary distribution transformer such as a transformer between a medium voltage network and a 240V/120V. 60 Hz or 400V/230V, 50 Hz low voltage network generally known in e.g. US and Europe, respectively.

It is evident that any of the embodiments discussed above under the first and second aspects may be equally applicable for the third aspect.

BRIEF DESCRIPTION OF THE DRAWINGS

FIG. 3 shows a thermal model for determining the transformer temperature.

FIG. 4A shows graphs illustrating operation without harmonic currents.

FIG. 4B shows graphs illustrating operation with harmonic currents.

DETAILED DESCRIPTION OF THE DRAWINGS

Figure 1:
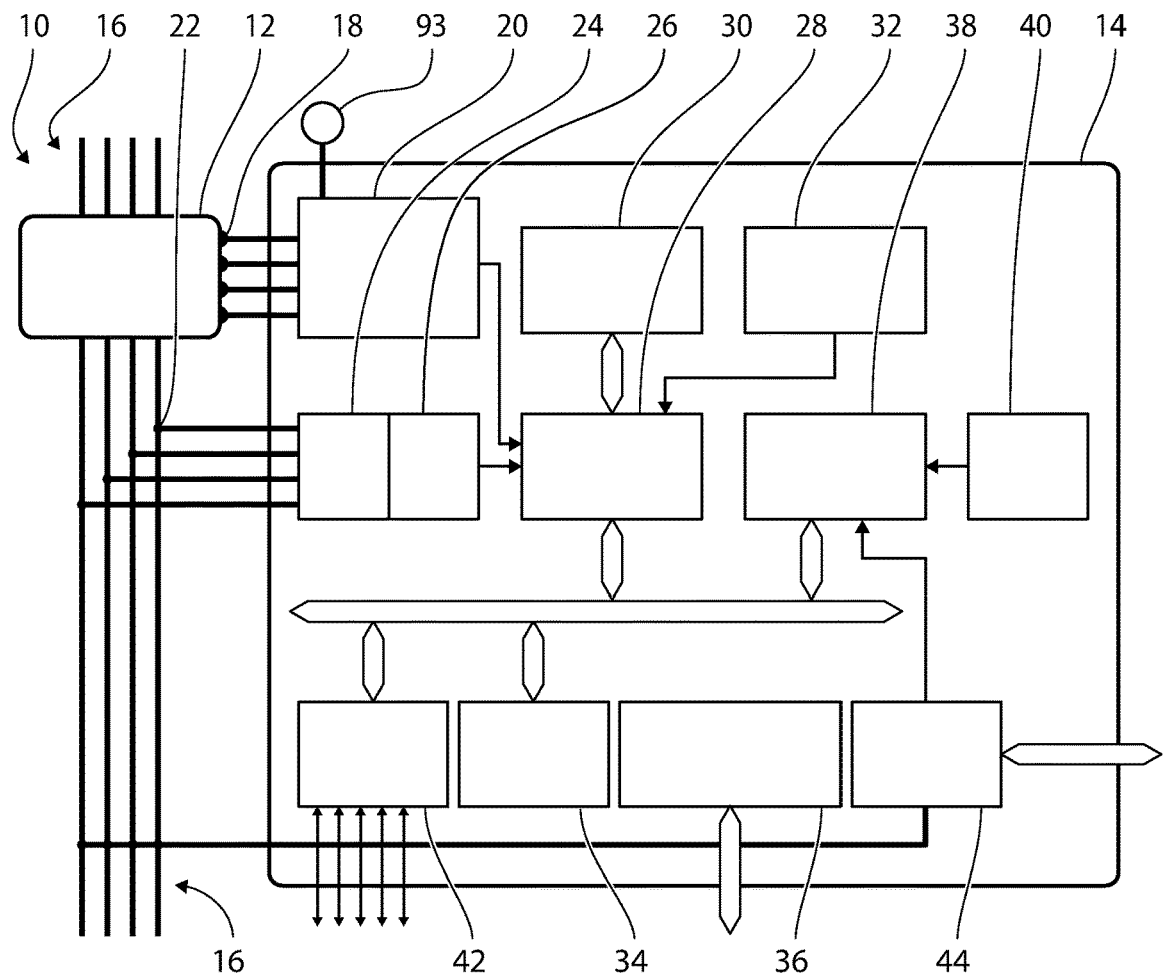
FIG. 1 shows an assembly comprising an electrical device and a system for determining the reduction of remaining service life of a transformer.

FIG. 1 shows an assembly 10 comprising the device to be tested, i.e. the transformer 12 and the system 14 for determining the remaining service lifetime in real-time of an electrical device (such as distribution transformers) in an alternating current distribution network 16. Its use is not limited to the remaining lifetime estimation function. Beside the measurement of the underlying values like current, voltage and phase angle and frequency, it can process, store, profile, display and transmit derived quantities such as power, energy, frequency, harmonic content and more.

The system 14 for determining the remaining lifetime of an electrical device in an AC power distribution network 16 further comprises temperature sensors 18 for measuring temperature and optionally all kinds of other physical parameters (e.g. humidity, etc.). The measured data is received by a temperature measurement device 20.

Further, the system 14 comprises electrical sensors 22 of different technologies (such as electro-magnetic measuring transformers, Rogowski coils, opto-electrical sensors, etc.) for measuring the electrical quantities in the distribution network 16. One or more electrical systems can be measured. (e.g. transformer measurement on LV and MV side) The electrical signals measured by the sensors 22 are processed by a current measurement device 24 and a voltage measurement device 26. All measured signals are then fed to a microprocessor 28.

The system 14 may further comprise a display 30 for displaying important data and information, control buttons 32 for inputting data or parameters by an operator and/or service person. A memory device 34 is used for temporarily storing the measured signals, the data and calculated values from the measuring devices 20, 24, 26 or the microprocessor 28. In the memory device 34, the firmware and the adjustment parameters of the measurement devices 20, 24, 26 are also stored.

A local communication interface 36 is used for connecting a local computer unit (not shown) with which a service task can be executed or data can be read out from the system 14 or to connect an external Display/Operating unit. The interface can be implemented in various technologies (for example R485, Ethernet, wireless, NFC, etc.). The local communication interface 36 can also be connected to multiple devices by a bus structure (e.g. multiple displays, additional meter, etc.).

A power supply unit 38 which is connected to the power distribution network 16 by one or more phases is powering the individual building blocks of the system. To operate the system 14 also in case of missing supply voltage an energy reserve 40 (for example, rechargeable battery) is provided.

Via the I/O unit (inputs/outputs) 42 the system 14 can transmit status Information, alarms, or other control signals to the outside world as well it can receive information from the outside world from external sensors or devices. This information can be provided in the form of a digital signal or an analogue value.

A WAN modem 44 of different technologies (e.g. GSM, GPRS, LTE, wireless mesh, PLC, WiMAX, Ethernet, O-Fiber, . . . ) is provided for connecting to a central system (not shown) via the WAN (World Area Network). This connection is used to exchange information and data and for transferring the control commands between the system 14 and a central system (not shown). The modem 44 may be designed in a modular (or integrated) way. This communication link may also be used for setting parameters remotely or download new firmware versions from a central system down to the system 14.

The processor 28 is used to control the whole system 14. It organizes the exchange of information/data with the various sensors 18, 22 and the measurement devices 20, 24, 26. It organizes the storage of data in the memory module 34, the reading of buttons 32, the displaying of information on the display 30 and the communication with the various Interfaces 34, 42, 44. The algorithms which determine the remaining service life of the monitored device 12 also run in the processor 28.

The device shown in FIG. 1 can be implemented as an integrated "all in one" box solution with modular communications modem 44 or as a collection of function blocks in the form of printed circuit boards or modules, which are connected by cables or other electrical connections.

For determining the remaining life of the transformer 12 a multiple step analysis-/evaluation procedure is applied:

The electrical quantities (e.g. in a transformer current I, voltage U, phase angle phi, harmonics/inter-harmonics, transient over-voltages) are detected by the electrical sensors 22 and the measurement devices 24, 26. This detection is carried out with a measuring cycle in the range of 1 μs . . . 1 sec. Other physical parameters (e.g. the ambient temperature of a transformer) are detected and measured with the temperature sensors 18 and the measurement device 20 with a measurement cycle is in the range of 1 second to 60 minutes. The detected values of the measurement devices 20, 24, 26, are forwarded to the processor 28 for further processing.

Figure 2:
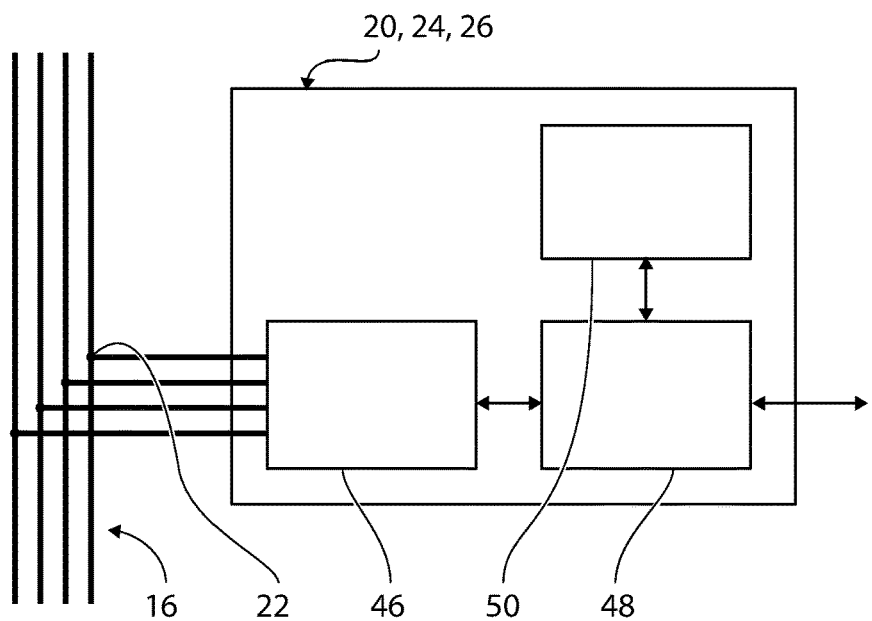
FIG. 2 shows the working principle of the temperature, current- and voltage measurement devices.

FIG. 2 shows a detailed view of the measuring devices 20, 24, 26 for pre-processing of the sensor signals. The measuring devices 20, 24, 26 comprise a high-speed A/D converter 46, a processor 48 and a memory block 50. This ensures that fast measurement cycles can be processed.

In these measurement devices 20, 24, 26 the signals will be pre-processed and in an aggregated form (e.g. averages values) and forwarded to the processor 28 for further processing. Hereinafter the temperature measurement device 20 will be discussed; however, the electrical measurement devices 24, 26 work analogous, albeit with a higher sampling rate.

In the first step of the analysis procedure the measured values of the temperature measurement system 20 will be analyzed with the help of a physical model (e.g. thermal model). The output of this calculation is a value (e.g. temperature in a transformer) which represents the status of the transformer 12 in regards of the effect on the lifetime at this current time point.

When the system is installed, the temperature model may be calibrated. With the help of a temperature measurement device 18 and a temperature sensor for ambient temperature 93, the corresponding physical variable (e.g. temperature) of the electrical device 12 can be measured and be used to adjust or calibrate the model or its parameters. After calibration of the model the physical value does not need to be measured anymore and the temperature measurement device may be removed. There is always one temperature sensor 93 needed to measure the ambient temperature in order to offset the temperature model because the model does not calculate the absolute temperature but the relative change of the temperature. The cycle frequency at which the first level of the procedure is calculating such output values is related to the dynamics of the device and its physical quantities. It is typically in the range of 1 second to 60 minutes.

FIG. 3 shows the details of the thermal model 52. The thermal model has as an input 54 current, voltage, and ambient temperature outside the transformer. The input values 54 are transformed into frequency domain by the use of FFT 56, converted into transformer temperature 60 using an appropriate algorithm 62, and transformed back into time domain 64 using an inverse FFT 66.

FIG. 4A shows a graph Illustrating the operation without harmonic load 68. When the transformer is operating without harmonic load, the magnitude of the higher order harmonics is 0. The transformer may thus operate up to the maximum operating temperature ($T_{opmax}$) without any accelerated aging. The temperature dependent aging factor is thus equal to one.

FIG. 4B shows a graph illustrating the operation with harmonic load 70. This aging component is applied only if the monitored device is additionally loaded by harmonic currents. Such a case is incorporated by a reduction (derating) of the maximum allowable operating temperature ($T_{opmax}$).

The following formula describes the determination of the "derating" by harmonics in a transformer.

$$-\Delta T opmax = \text{function}\left[\sum_{h=1}^{h=hmax}\left(\frac{Ih}{I1}\right)^2\right]$$

To calculate the reduction we use the "K-Factor derating methods" (US method) which is similar to the proposed European method stated in the standard EN 50464-3.

This results in the reduced (derated) maximal operating temperature T'raduced as follows:

$$T'opmax = Topmax * \left(\frac{1}{K}\right)$$

Example: transformer with maximum nominal operating temperature $T_{opmax}=80°$ C. The burden generated by harmonic leads to a K factor=1.15. This means that the reduced maximum operating temperature $T'_{opmax}=80*1/1.15=69.6°$ C.

Determining the intensity of usage of life points is thus either in a linear region (Top<Topmax) or in an exponential range (Top>Topmax). Additional stress factors caused by special operating conditions (e.g. presence of harmonic currents) can shift the boundary between the two areas.

Figure 5:
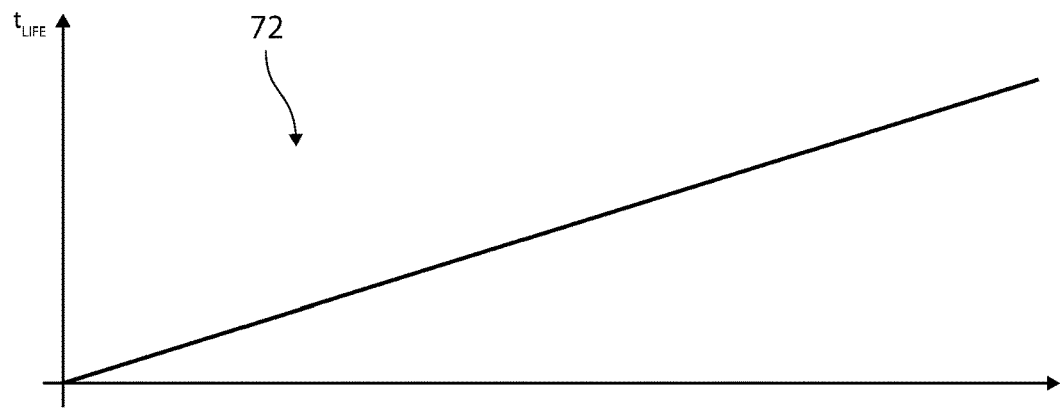
FIG. 5 shows a graph illustrating linear aging.

FIG. 5 shows a graph illustrating linear aging 72. The output values of level 1 which is a measure of the influence on the service life of the device will now be evaluated in the second stage to its quantitative influence on the lifetime of the device.

The "consumption" of life is determined in the rhythm in which the output variable from level 1 arrives to level 2. For this purpose, the device is assigned to a number of life points (e.g. a transformer has a lifespan of 50 years=1'576'800'000 seconds, 1 second lifetime is equal to 1 life point. >>> The transformer has in its new condition an amount of 1'576'800'000 life points). This information will be stored in the memory module of the system as a parameter of the electrical device.

In the evaluation rhythm and depending on the current load and the current operating point of the electrical device more or less life points will be subtracted from the device's "life point account". In case the electrical device is overloaded disproportionately more life points will be deducted from the life point account. In case the load of the electrical device is within its nominal range the lifetime deduction will only be proportional. At the end of each cycle in level 2, remaining life points and with this the remaining lifetime of the device is calculated. The remaining lifetime is stored in the memory module as a variable.

Linear Aging Factor:

The linear aging factor is applied when the equipment is operated within the nominal operating conditions (e.g. a transformer has a maximum allowable operating temperature of 80° C.).

As long as the device is operated below this maximum temperature, linear lifetime point consumption must be assumed. The consumption of lifetime essence in these operating conditions is linearly related to the time elapsed.

$\Delta$lifetime: $\Delta nL = k*t$

Example: a transformer with maximum nominal operating temperature $T_{opmax}=80°$ C. operates at a operating temperature of Top<80° C.:

Total life=50 years (1'576'800'000 seconds) corresponds to a total amount of life points of $NL_{Total}=1'576'800'000$ points, that corresponds to a linear consumption constant of k=1 [1/s]

A transformer which operates for 24 hours (86400 seconds) in this linear range condition consumes 86400 life points;

$\Delta nL = k*t = 1*86400 = 86400$ points

Figure 6:
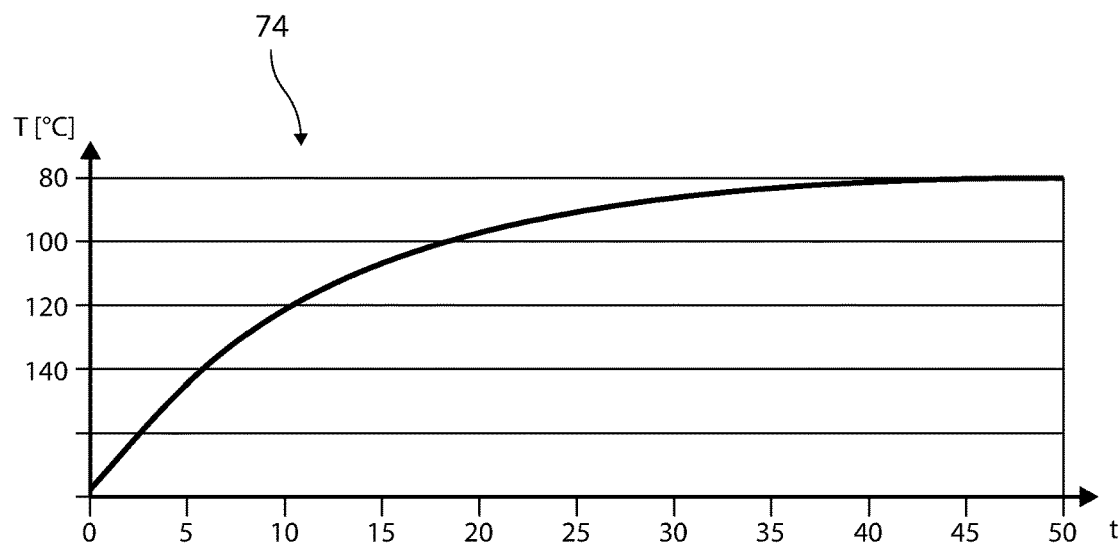
FIG. 6 shows a graph illustrating the reduction of lifetime of a transformer.

FIG. 6A shows a graph illustrating the reduction of lifetime of a transformer using an exponential aging factor 74. This aging factor is used when the device is operated outside the nominal operating conditions (e.g. a transformer has a maximal operating temperature of 80° C.). Once the device is operated above this maximal temperature, exponential lifetime consumption must be expected.

$\Delta nL = t*k*2\hat{}((T_{op}-T_{opmax})/x)$

Where k:=linear consumption constant
$T_{op}$:=Operating temperature
$T_{opmax}$:=Max. Operating temperature
x: Temperature difference for a doubling of the aging rate Example: Transformer with a maximum nominal operating temperature Topmax=80° C. operates at an operating temperature Top=88° C.; x=8

A transformer which, for example, operates for 24 hours (86400 seconds) in this area uses the following exponential lifetime points:

$$\Delta Lifetime: \Delta nL = t*k*2\hat{}((T_{op} - T_{opmax})/8)$$

$$\Delta nL = 86400*1*2\hat{}((88-80)/8) = 172800$$

Figure 7:
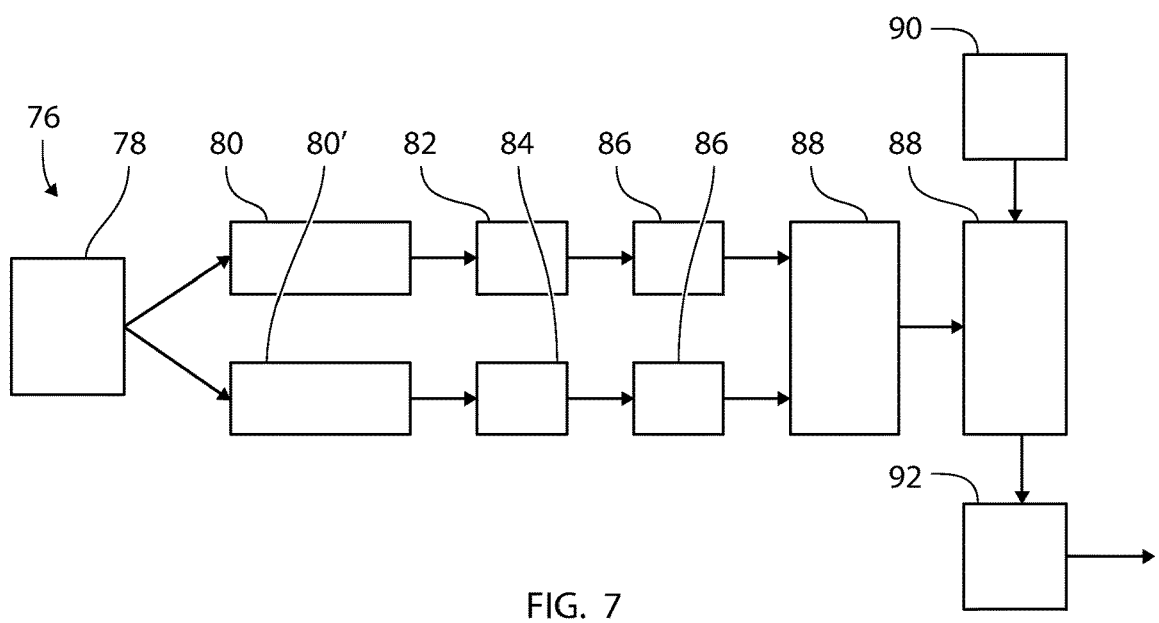
FIG. 7 shows a flowchart to be used for determining the remaining service life of a transformer.

FIG. 7 shows a flowchart for determining remaining service lifetime 76 of an electrical device. Level 2 of the method of analysis for a transformer with the output "remaining lifetime"

For determining the intensity of usage of life points the following aging factors are considered.

Linear aging factor
Exponential aging factor
Aging through loads with harmonics
Aging through special occurrences as transient overvoltages The first step 78 is to determine whether harmonics are present or not, and to establish the reduced maximum operating temperature as the nominal maximum operating temperature minus a correction temperature depending on the amount of harmonics.

The second step 80, 80' is to establish whether linear or exponential aging is to be used, i.e. if the measured temperature (T) is above or below the reduced maximum operating temperature. The temperature dependent aging factor is then established to be either one (linear aging 82) or greater than one (exponential aging 84)

In the third step 86 the transient aging factor depending on the presence or non-presence of voltage transients is applied. The results yield a $\Delta L$ being the reduction of lifetime in the specific time period 88. By taking the remaining lifetime 90 from the last time period and subtracting the value ΔL, a new remaining lifetime is established for the time period and the next time period in the calculation cycle may start.

Aging factor due to special occurrences: transient overvoltages.

Occurrence of voltage levels above the specified maximal operating voltage is stressing the isolation of a transformer. Continuous additional stress due to an increased electrical field may accelerate the aging of the transformer. With this additional factor it is intended to consider such effects on the lifetime consumption.

For this purpose additional acceleration aging factors are introduced which shall represent the level and the time of transients.

Additional stress factor due to transients:
AACF: Additional acceleration factor due to stress of transient voltages
T: integration time
t: time the voltage exceeds the maximal allowed voltage of the transformer
Uo: transient overvoltage peak
Umax: maximal allowed nominal voltage
K: Constant which allows to adjust the stress factor (transformertypes special circumstances)

$$AACF = k*t/rT((Uo/Umax-1))/2$$

Example: a transformer with maximum nominal voltage of 500V and transients of t=10 mS/Uo=3000V Umax=500V, Uo=3000V, T=1 sec, k=1

$$AACF = 1*0.01/1*((3000/500-1))/2 = 0.025$$

The application of this additional aging factor when determining a transformer's lifetime is more efficient when measuring on the primary side of the transformer.

The different lifetime calculation modes linear, exponential will be offset with the AACF factor if applicable.

$$\Delta nL = (1+AACF)*k*t$$

$$\Delta nL = (1+AACF)*t*k*2^{((Top-Topmax)/x)}$$

Alarm at a Certain Residual Lifetime

In each cycle the calculated remaining lifetime of the device is compared in the μProcessor with a threshold value stored in the memory. With this an alarm can be triggered after the consumption of a certain number of life points (e.g. 80% of the total life). This alarm is transmitted over the WAN modem to a central system and/or will be displayed on the local display.

Description of the synchronization method between the electrical device and the system.

The system can be synchronized with the electrical device in the following cases:

Case 1: Initial installation of a system at a newly installed electrical device.

Case 2: Initial installation of a system at an already installed electrical device which has been in operation for some time.

Case 3: Second installation of a system at the same electrical device or a replacement of a defective system.

Synchronization Case 1:

In case 1 a new device is put into operation and at the same time a system is installed at the electrical device. The system must be programmed with the parameters that characterize the electrical device and with the expected lifetime of it. Additionally desired limits will be programmed (e.g. "Alarm if 90% of the life points have been used up").

Synchronization Case 2

In case 2, a new system is installed at the electrical device. This electrical device has already been in operation for some time. The system will be programmed with the parameters which characterize the electrical device and the expected life of the electrical device. In addition there must be Information related to the already elapsed lifetime of the electrical device. The following data are necessary:

Age of the electrical device under test
Operating time of the electrical device under test
Stress level that the electrical device to be tested has been exposed to in the elapsed time.

Setting the age and operating time of the electrical device requires no special measures. For setting the stress level the electrical device that has been exposed to in the already elapsed time the system provides two methods which help to determine the already consumed life points. It is the method of "categorizing" and the process of "adaptive learning".

Method of Categorizing:

This method uses a table in which the load and the application conditions to which the electrical device has been exposed is estimated. This is a subjective estimation of the past. Based on this information, the already consumed life points and the remaining lifetime of the electrical device (1) will be determined and the defined.

| | | | | Relative time | | | |
|---|---|---|---|---|---|---|---|
| Load % of nominal load | <10% | <20% | <40% | <60% | <80% | <90% ✓ | <=100% |
| Overload time | ✓ | | | | | | |
| Overload, level of | 5% | ✓ 10% | | 15% | 20% | 25% | 30% |
| Harmonics | None: ✓ | | | Low: | | High: | |
| Relative time with harmonics | <10% ✓ | <20% | <40% | <60% | <80% | | <=100% |
| Impact of Transients | Yes ✓ No | Transient Level (x * Unominal) | | 4 Transient duration (‰) | 50 | frequency of occurence | Seconds Minutes Hourly ✓ daily monthly |
| Outdoor Average temperature of environment | | | | Indoor 20 Deg. C. | | ✓ | |

The process of "adaptive learning":

The process of "adaptive learning" is well suited for electrical devices in which the application conditions during the elapsed lifetime are similar to the expected conditions in the near future. The load characteristics over a period of 3 . . . 12 months will be analyzed by the system. After 3 . . . 12 months an assessment of the past is then made and the variable "Already spent life points" calculated by the system and will be adjusted accordingly for the past time.

Synchronization Case 3;

In this case a second installation of system at the same electrical device is made. This is the case when a system must be replaced due to failure or end of life. It is necessary in case the service life of a system is shorter than the lifetime of the electrical device under test.

Also in case a system is defective, the synchronization must be done according to this case upon replacement of the system.

When using this synchronization method, all the stored parameters and the calculated data must be transferred from the old to the new system.

It is evident that the present technology may be used in various other ways. The arrangement of the system may include in addition to the method for determining the remaining lifetime also elements to capture and compute values such as electric power, energy, frequency and harmonic components etc.

These values are calculated, processed, stored, profiled, displayed and transmitted in/from the same system. The combination of an electric meter for measuring power/energy with the system may also be contemplated.

REFERENCE NUMERALS

10. Assembly
12. Transformer
14. System for determining reduction of remaining service lifetime of an electric device
16. Power distribution network
18. Temperature sensors
20. Temperature measurement device
22. Electrical sensors
24. Current measurement device
26. Voltage measurement device
28. Microprocessor
30. Display
32. Button
34. Memory
36. Local com port
38. Power supply
40. Reserve power supply
42. I/O port
44. WAN modem
46. A/D converter
48. Microprocessor
50. Memory
52. Thermal model
54. Input (time domain)
56. FFT
58. Power input (frequency domain)
60. Temperature (frequency domain)
62. Algorithm
64. Temperature (time domain)
66. inverse FFT
68. Operation without harmonics
70. Operation with harmonics
72. Linear aging
74. Exponential aging
76. Determining remaining service lifetime
78. Harmonics Yes/No
80. Determining reduced maximum operating temperature
82. Exponential aging factor
84. Linear aging factor
86. Transient overvoltage factor
88. Reduction of remaining operation lifetime
90. Remaining operation lifetime from last specific time period
92. New remaining operation lifetime after current specific time period
93. Temperature sensor for ambient temperature

The invention claimed is:

1. A method of determining a reduction of remaining service lifetime of an electrical device during a specific time period of operation of said electrical device, said electrical device being connected to a power distribution network, and having a maximum operating voltage and a maximum operating temperature, said method comprising the steps of:
   providing a measurement system comprising a voltage measurement device, a current measurement device, and a temperature measurement device,
   measuring a set of voltage values corresponding to the voltage applied to said electrical device by said power distribution network during said specific time period by using said voltage measurement device,
   measuring a set of current values corresponding to the current applied to said electrical device by said power distribution network during said specific time period by using said current measurement device,
   measuring a set of ambient temperature values corresponding to the temperature of said electrical device during said specific time period by using said temperature measurement device,
   determining a temperature dependent aging factor on the basis of a temperature value, and
   determining said reduction of remaining service life on the basis of said specific time period, and said temperature dependent aging factor,
   wherein said temperature measurement device is adapted to measure an ambient temperature outside said electrical device and derive said temperature value from said set of ambient temperature values, said set of current values, and said set of voltage values.

2. Method according to claim 1, wherein for deriving said temperature value, a total power used by said electrical device is derived from said set of current values and said set of voltage values.

3. Method according to claim 2, wherein the total power used and a loss factor are used to calculate a total power loss representing a heat generation inside of the electrical device.

4. Method according to claim 1, wherein a thermal model is used for calculating the temperature inside the electrical device.

5. Method according to claim 4, wherein the thermal model includes a humidity parameter.

6. Method according to claim 4, wherein the thermal model has input values including the ambient temperature outside said electrical device, said set of current values, and said set of voltage values, and wherein the input values are being transformed into frequency domain by use of an FFT, converted into a transformer temperature of a transformer of the electrical device, and transformed back into time domain by using an inverse FFT.

7. Method according to claim 1, further comprising the steps of
   determining an amount of harmonic load on said electrical device on the basis of said set of current values,
   determining a reduced maximum operating temperature of said electrical device on the basis of said amount of harmonic load and said maximum operating temperature, and
   determining the temperature dependent aging factor on the basis of said temperature value and said reduced maximum operating temperature.

8. Method according to claim 7, wherein said set of current values is divided into a set of fundamental currents and a set of higher order harmonic currents and said reduced maximum operating temperature is a function of said maximum operating temperature and a relation between said set of fundamental currents and said set of higher order harmonic currents.

9. Method according to claim 8, wherein when said temperature value is equal to or lower than said reduced maximum operating temperature, said temperature dependent aging factor is equal to one, whereas when said temperature value is higher than said reduced maximum operating temperature, said temperature dependent aging factor is exponentially dependent on the difference between said temperature value and said reduced maximum operating temperature.

10. Method according to claim 8, wherein the difference between the maximum operating temperature and the reduced maximum operating temperature is described according to the following formula:

$$\Delta Topmax = f\left[\sum_{h=1}^{h=hmax}\left(\frac{Ih}{I1}\right)^2\right]$$

wherein $\Delta Topmax$ is the difference between the maximum operating temperature and the reduced maximum operating temperature, Ih is the magnitude of the $h^{th}$ harmonic and I1 is the fundamental current.

11. Method according to claim 1, further comprising the steps of determining an amount of transient over-voltages on said power distribution network at said electrical device on the basis of said set of voltage values and said maximum operating voltage,
determining a transient aging factor corresponding to the relation between said amount of transient over-voltages and said set of voltage values,
determining said reduction of remaining service life on the basis of said transient aging factor.

12. Method according to claim 11, wherein said reduction of remaining service lifetime is equal to said specific time period times said transient aging factor times said temperature dependent aging factor.

13. A method of determining the remaining service life of an electrical device by storing a nominal service life of said electrical device in a memory unit and during a specific time period of operation of said electrical device deducting from said nominal service life a reduction of remaining service lifetime of said electrical device during the specific time period of operation of said electrical device, said electrical device being connected to a power distribution network, and having a maximum operating voltage and a maximum operating temperature, said method comprising the steps of:
providing a measurement system comprising a voltage measurement device, a current measurement device, and a temperature measurement device,
measuring a set of voltage values corresponding to the voltage applied to said electrical device by said power distribution network during said specific time period by using said voltage measurement device,
measuring a set of current values corresponding to the current applied to said electrical device by said power distribution network during said specific time period by using said current measurement device,
measuring a set of ambient temperature values corresponding to the temperature of said electrical device during said specific time period by using said temperature measurement device,
determining a temperature dependent aging factor on the basis of a temperature value, and
determining said reduction of remaining service life on the basis of said specific time period, and said temperature dependent aging factor,
wherein said temperature measurement device is adapted to measure an ambient temperature outside said electrical device and derive said temperature value from said set of ambient temperature values, said set of current values, and said set of voltage values.

14. A system for determining a reduction of remaining service lifetime of an electrical device during a specific time period of operation of said electrical device, said electrical device adapted to be connected to a power distribution network, said electrical device having a maximum operating temperature and a maximum operating voltage, said system comprising a measurement system comprising a voltage measurement device, a current measurement device, and a temperature measurement device, said measurement system adapted to carry out the steps of:
measuring a set of voltage values corresponding to the voltage applied to said electrical device by said power distribution network during said specific time period by using said voltage measurement device,
measuring a set of current values corresponding to the current applied to said electrical device by said power distribution network during said specific time period by using said current measurement device,
measuring a set of ambient temperature values corresponding to the temperature of said electrical device during said specific time period by using said temperature measurement device,
determining a temperature dependent aging factor on the basis of a temperature value, and
determining said reduction of remaining service life on the basis of said specific time period, and said temperature dependent aging factor,
wherein said temperature measurement device is adapted to measure an ambient temperature outside said electrical device and derive said temperature value from said set of ambient temperature values, said set of current values, and said set of voltage values.

15. An assembly comprising an electrical device, preferably an inductive electrical de-vice, more preferably a transformer, most preferably a secondary distribution transformer, and a system according to claim 14.

* * * * *